United States Patent
Epstein et al.

(10) Patent No.: US 10,650,323 B2
(45) Date of Patent: May 12, 2020

(54) XX COUPLER FOR FLUX QUBITS (71) Applicants: Ryan J. Epstein, Denver, CO (US); David George Ferguson, Takoma Park, MD (US)

(72) Inventors: Ryan J. Epstein, Denver, CO (US); David George Ferguson, Takoma Park, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/255,588

(22) Filed: Jan. 23, 2019

(65) Prior Publication Data
US 2019/0156237 A1    May 23, 2019

Related U.S. Application Data

(62) Division of application No. 15/433,730, filed on Feb. 15, 2017, now Pat. No. 10,255,557.

(51) Int. Cl.
*G06N 10/00* (2019.01)
*H03K 19/195* (2006.01)
*B82Y 10/00* (2011.01)

(52) U.S. Cl.
CPC .......... *G06N 10/00* (2019.01); *H03K 19/195* (2013.01); *B82Y 10/00* (2013.01)

(58) Field of Classification Search
CPC ....... G06N 10/00; H03K 19/195; B82Y 10/00
See application file for complete search history.

(56) References Cited

U.S. PATENT DOCUMENTS

| 5,552,735 A | 9/1996 | Kang et al. |
| 7,969,178 B2 | 6/2011 | Przybysz et al. |

(Continued)

FOREIGN PATENT DOCUMENTS

| EP | 2730029 A2 | 5/2014 |
| EP | 3254375 A1 | 12/2017 |

(Continued)

OTHER PUBLICATIONS

Rafique et al.: Tunable filter based on DC-SQUID chain 1; May 1, 2007 (May 1, 2007), pp. 1-2, XP055585121, DOI: 10.13140/RG.2.1.1612.5688, Retrieved from the Internet: URL:https://www.researchgate.net/profile/RaihanRafique2/publication/305769905 Tunable filter based on DC SQUID chain/links/57a07d4408ae94f454eb0968/Tunable-filter-based-on-DC-SQUID-chain.pdf [retrieved on May 2, 2019].

(Continued)

*Primary Examiner* — Seokjin Kim
(74) *Attorney, Agent, or Firm* — Tarolli, Sundheim, Covell & Tummino LLP (57) ABSTRACT

Systems and methods are provided for coupling two flux qubits. A quantum circuit assembly includes a first flux qubit, having at least two potential energy minima, and a second flux qubit, having at least two potential energy minima. A system formed by the first and second qubits has at least four potential energy minima prior to coupling, each of the four potential energy minima containing at least one eigenstate of a system comprising the first flux qubit and the second flux qubit. A coupler creates a first tunneling path between a first potential energy minimum of the system and a second potential energy minimum of the system, and a second tunneling path between a third potential energy minimum of the system and a fourth potential energy minimum of the system. The coupler creates the first and (Continued)

second tunneling paths between potential energy minima representing states of equal bit parity.

10 Claims, 4 Drawing Sheets

(56) References Cited

U.S. PATENT DOCUMENTS

| | | | |
|---|---|---|---|
| 9,647,662 | B1 | 5/2017 | Abutaleb et al. |
| 9,710,758 | B2 | 7/2017 | Bunyk et al. |
| 9,768,771 | B2 | 9/2017 | Naaman |
| 9,928,948 | B2 | 3/2018 | Naaman et al. |
| 10,042,805 | B2 | 8/2018 | Naaman et al. |
| 2006/0147154 | A1 | 7/2006 | Thom et al. |
| 2008/0048762 | A1 | 2/2008 | Inamdar et al. |
| 2009/0078931 | A1 | 3/2009 | Berkley |
| 2010/0148853 | A1 | 6/2010 | Harris et al. |
| 2011/0054876 | A1* | 3/2011 | Biamonte ............... B82Y 10/00 703/15 |
| 2015/0254571 | A1 | 9/2015 | Miller et al. |
| 2016/0335558 | A1* | 11/2016 | Bunyk ................... G06N 10/00 |
| 2016/0335560 | A1 | 11/2016 | Mohseni et al. |
| 2017/0286859 | A1 | 10/2017 | Harris et al. |
| 2018/0091115 | A1 | 3/2018 | Abdo |
| 2019/0007051 | A1 | 1/2019 | Sete et al. |

FOREIGN PATENT DOCUMENTS

| | | |
|---|---|---|
| JP | 2013-058705 A | 3/2013 |
| JP | 5363993 B2 | 12/2013 |
| WO | 20100028183 A1 | 3/2010 |
| WO | 2014028302 A2 | 2/2014 |
| WO | 20160126981 A1 | 8/2016 |
| WO | 2017062143 A1 | 4/2017 |
| WO | 20170058194 A1 | 4/2017 |
| WO | 2017/111949 | 6/2017 |
| WO | 2017127205 A1 | 7/2017 |
| WO | 2017022806 A1 | 11/2017 |
| WO | 2017/222806 | 12/2017 |

OTHER PUBLICATIONS

International Search Report from corresponding PCT/US2019/018497; dated May 15, 2019.
Lu: "Master Thesis Towards Tunable Coupling Between Two Superconducting Transmission Line Resonators"; Aug. 24, 2012 (Aug. 24, 2012), XP055585125, Retrieved from the Internet:URL:https://www.wmi.badw.de/publications/theses/Xiaoling, Lu Master Thesis 2012.pdf [retrieved on May 2, 2019]; abstract, section 1, section 2, section 3, section 4.
Tuorila et al: "Efficient protocol for qubit initialization with a tunable environment", arxiv.org, Cornell University Library, 201, Olin Library Cornell University Ithaca, NY 14853, Dec. 13, 2016 (Dec. 13, 2016), XP080743892, DOI: 10.1038/S41534-017-0027-1; abstract, figures 1-3, p. 1, line 1-p. 7, last line.
International Search Report from corresponding PCT/US2019/012065, dated May 17, 2019.
Chen et al.: "Qubit Architecture with High Coherence and Fast Tunable Coupling", Physical Review Letters, US, (Nov. 26, 2014), vol. 113, No. 22, doi:10.1103/PhysRevLett.113.220502, ISSN 0031-9007.
Ehara, et al.: "Development of Pulse Transfer Circuits for Serially Biased SFQ Circuits Using the Nb 9-Layer 1um Process", IEEE Transactions on Applied Superconductivity, IEEE Service Center (Jun. 1, 2013), vol. 23, No. 3, p. 1300504.
International Search Report corresponding to International application No. PCT/US2019/012068 dated Mar. 25, 2019.
Australian Search Report corresponding to Australian Patent Application No. 2016388350, dated Jan. 7, 2019.
Chen,Y. et al. "Qubit architecture with high coherence and fast tunable coupling." Physical review letters 113.22 (2014):2205022.
Written Opinion and Search Report corresponding to International Application No. PCT/US2019/014796 dated Apr. 26, 2019.
Anonymous: What is the self-resonant frequency of a capacitor?, May 22, 2017, XP055582197, Retrieved from the Internet:URL:https://www.quora.com What-is-the-self-resonant-frequency-of-a-capacitor[retrieved on Apr. 17, 2019] the whole document.
Tuori et al: 11 Efficient protocol 1-20 for qubit initialization with a tunable environment, arxiv .org, Cornell University Li Bra Ry, 201 Olin Library Cornell University Ithaca, NY 14853, Dec. 13, 2016 Dec. 13, 2016)'XP080743892,DOI: 10.1038/S41534-017-0027-1 abstract; figures 1-6 p. 1, line 1-p. 6, last line p. 8, line 1-p. 11, last line p. 13, line 10-p. 16, last line.
Robertson et al: "Superconducting device to isolate,entangle, and read out quantum flux states", Mar. 21, 2016, pp. 1-4,ResearchGate Retrieved from the Internet: IRL:https://www.researchgate.net/publication/255276503, Superconducting device to isolate entangle and read out quantum flux states[retrieved on Sep. 27, 2018]abstract; figures 1-4 p. 1, left-hand column, line 1-p. 4,right-hand column, last line.
Kafri:"Tunable inductive coupling of superconducting qubits in the Srongly nonlinear regime",arXiv:1606.08382v2,Jan. 23, 2017 (Jan. 23, 2017), xP055469297,Retrieved from the internet:URL:https://arxiv.orgabs1606.08382v2[retrieved on Apr. 20, 2018]abstract; figures 1-3 p. 1, line 1-p. 22, last line.
Schmitt et al: "Multiplexed readout of transmon qubits with Josephson Bifurcation amplifiers",Physical Review A (Atomic, Molecular, and Optical Physics),vol. 90, No. 6, Dec. 1, 2014 (Dec. 1, 2014), XP055511194, USA ISSN: 1050-2947, DOI: 10.1103/PhysRevA.90.062333 abstract; figures 1-4 p. 1, Left-hand column, line 1-p. 4,right-hand column, line 25.
Canadian Office Action Corresponding to Canadian Application No. 2,987,426 dated Apr. 8, 2019.
Lanting et al: "Cotunneling in pairs of coupled flux qubits", Physical Review B, vol. 82, 060512R, Aug. 23, 2010, XP055469296, figures 1(a) & (b).
International Search Report for International Application No. PCT/US2018/015729 dated May 2, 2018.
Ferguson et al: "Non-stoquastic XX couplers for superconducting flux qubits", Abstract submitted to the APS March Meeting 2017, Jan. 4, 2017, XP055469302, Retrieved from the Internet: URL: http://absimage.aps.org/image/Mar17/MWS_Mar17-2016-008291.pdf, abstract.
G. Samach, et al.: "Coupled qubits for next generation quantum annealing: novel interactions", Abstract submitted to the APS March Meeting 2017, Jan. 4, 2017, XP055469301, Retrieved from the Internet: URL: http://absimage.aps.org/image/MAR17-2016-003302.pdf, abstract.
International Search Report for International Application No. PCT/US2019/035607 dated Oct. 1, 2019.
International Search Report for International Application No. PCT/US2019/036576 dated Oct. 24, 2019.
Fabio Chiarello, et al: Superconducting tunable flux qubit with direct readout scheme: Superconducting tunable flux qubit with direct readout scheme:. Superconductor Science and Technology, IOP Publishing,K Techno House, Bristol, GB, vol. 18, No. 10, Oct. 1, 2005, pp. 1370-1373, XP020087996, ISSN: 0953-2048, DOI: 10.1088/0953-2048/18/10/021 Sections 1-3; figures 1, 2.
Final Office Action for U.S. Appl. No. 15/868,557 dated Jul. 25, 2019.
Japanese Office Action for Application No. 2018-533394 dated Aug. 20, 2019.
Non Final Office Action for U.S. Appl. No. 15/866,602 dated Aug. 21, 2019.
Non Final Office Action for U.S. Appl. No. 16/255,588 dated Sep. 5, 2019.
Worsham A H et al: "A Single Flux Quantum cross-bar switch and demultiplexer" IEEE Transactions on Applied Superconductivity, IEEE Service Center, Los Alamitos, CA, US, vol. 5, No. 2, Jun. 1, 1995 (Jun. 1, 1995), pp. 2996-2999, XP011504599, ISSN: 1051-8223, DOI: 10.1109/77.403222 Section II.; figure 1.
International Search Report for International Application No. PCT/US2019/012049 dated Dec. 4, 2019.

(56) References Cited

OTHER PUBLICATIONS

International Search Report for International Application No. PCT/US2017/036169 dated Sep. 25, 2017.
Yu Chen et al: "Qubit Architecture with High Coherence and Fast Tunable Coupling", Physical Review Letters, vol. 113, No. 22, Nov. 26, 2014 (Nov. 26, 2014), XP055403674, US ISSN: 0031-9007, DOI: 10.1103/PhysRevLett.113.220502 figure 1.
Ehara K et al: "Development of Pulse Transfer Circuits for Serially Biased SFQ Circuits Using the Nb 9-Layer 1-$\mu\hbox{m}$ Process", IEEE Transactions on Applied Superconductivity, IEEE Service Center, Los Alamitos, CA, US, vol. 23, No. 3, Jun. 1, 2013 (Jun. 1, 2013), p. 1300504, XP011513813, ISSN: 1051-8223, DOI: 10. 1109/TASC.2012.2233535 figure 1.
Kang H et al: "Current recycling and SEQ signal transfer in large scale RSFQ circuits", IEEE Transactions on Applied Superconductivity. IEEE Service Enter, Los Alamitos, CA, US, vol. 13, No. 2, Jun. 1, 2003 (Jun. 1, 2003), pp. 547-550, XP011097824, ISSN: 1051-8223, DOI: 10. 1109/TASC.2003.813932 figure 2.
Harris R et al: "Sign- and magnitude-tunable coupler for superconducting flux qubits", arxiv.org, Cornell University Library, 201 OLIN Library Cornell University Ithaca, NY 14853, Aug. 11, 2006 (Aug. 11, 2006), XP080248067, DOI: 10.1103/Physrevlett.98.177001 figure 1.

\* cited by examiner

XX COUPLER FOR FLUX QUBITS

GOVERNMENT INTEREST

This invention was made with government support under Federal Government Contract Number 30069353. The government may have certain rights in the invention.

RELATED APPLICATIONS

This application claims priority from U.S. patent application Ser. No. 15/433,730, filed 15 Feb. 2017, which is incorporated herein in its entirety.

TECHNICAL FIELD

This invention relates to quantum computing, and more particularly, to a coupler for coupling the X basis states of flux qubits.

BACKGROUND

A classical computer operates by processing binary bits of information that change state according to the laws of classical physics. These information bits can be modified by using simple logic gates such as AND and OR gates. The binary bits are physically created by a high or a low signal level occurring at the output of the logic gate to represent either a logical one (e.g., high voltage) or a logical zero (e.g., low voltage). A classical algorithm, such as one that multiplies two integers, can be decomposed into a long string of these simple logic gates. Like a classical computer, a quantum computer also has bits and gates. Instead of using logical ones and zeroes, a quantum bit ("qubit") uses quantum mechanics to occupy both possibilities simultaneously. This ability and other uniquely quantum mechanical features enable a quantum computer can solve certain problems exponentially faster than that of a classical computer.

SUMMARY OF THE INVENTION

In accordance with an aspect of the present invention, a quantum circuit assembly includes a first flux qubit, having at least two potential energy minima, and a second flux qubit, having at least two potential energy minima. A system formed by the first qubit and the second qubit has at least four potential energy minima prior to coupling, each of the four potential energy minima containing at least one eigenstate of a system comprising the first flux qubit and the second flux qubit. A coupler creates a first tunneling path between a first potential energy minimum of the system and a second potential energy minimum of the system, and a second tunneling path between a third potential energy minimum of the system and a fourth potential energy minimum of the system. The coupler creates the first and second tunneling paths between potential energy minima representing states of equal bit parity, such that the first potential energy minimum represents the state |01⟩, the second potential energy minimum represents the state, |10⟩, the third potential energy minimum represents the state |00⟩, and the fourth potential energy minimum represents the state, |11⟩.

In accordance with another aspect of the present invention, a method is provided for coupling quantum states of two flux qubits. A first flux qubit is electrically coupled to a second flux qubit via a coupler comprising at least one tunable Josephson junctions to create a first tunneling path, between a first pair of potential energy minima associated with a system formed by the first and second qubit, and a second tunneling path, between a second pair of potential energy minima associated with the system. A control signal is applied to the at least one tunable junction to tune one of a first tunneling energy associated with the first tunneling path and a second tunneling energy associated with the second tunneling path.

In accordance with yet another aspect of the present invention, a quantum circuit assembly includes a first flux qubit, having at least two potential energy minima and a second flux qubit, having at least two potential energy minima. A system formed by the first qubit and the second qubit has at least four potential energy minima prior to coupling, each of the four potential energy minima containing a quantum state of a system comprising the first flux qubit and the second flux qubit. A coupler, comprising a plurality of tunable Josephson junctions, creates a first tunneling path between a first potential energy minimum of the system and a second potential energy minimum of the system, and a second tunneling path between a third potential energy minimum of the system and a fourth potential energy minimum of the system. The coupler is tunable via a control signal applied to at least one of the plurality of tunable junctions to tune a first tunneling energy associated with the first tunneling path and a second tunneling energy associated with the second tunneling path.

DETAILED DESCRIPTION

Systems and methods are providing XX coupling between two flux qubits. An XX coupling between two qubits makes it energetically favorable for the states of the first and second qubits to align in the same direction along the X-axis, both pointing either in the +X direction or both in the −X direction. Each axis corresponds to a specific quantum state defined on the Bloch sphere of the qubit. XX interactions have multiple uses including generating non-stoquastic Hamiltonians, generally in conjunction with ZZ and Z Hamiltonian terms that are used on quantum annealing machines, various quantum logic gates, such as those described in co-pending application Ser. No. 15/225,102 filed Aug. 1, 2016 and titled "Quantum Gates Via Multi-Step Adiabatic Drag", which is hereby incorporated by reference, and various passive noise suppression schemes, such as those described in co-pending application Ser. No. 15/225, 210 filed Aug. 1, 2016 and titled "Quantum Operations with Passive Noise Suppression", which is hereby incorporated by reference.

Figure 1:
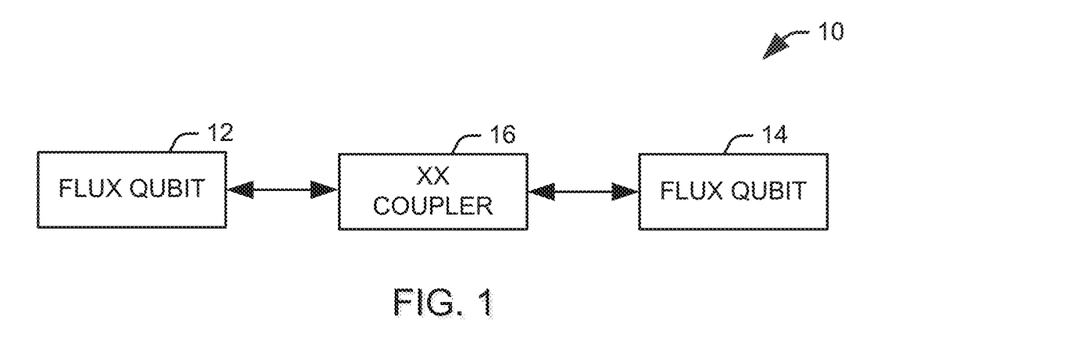
FIG. 1 illustrates one example of system comprising two coupled flux qubits.

FIG. 1 illustrates one example of system 10 comprising two coupled flux qubits. The system includes a first flux qubit 12 and a second flux qubit 14 operatively coupled to the first flux qubit via an XX coupler 16. A flux qubit, in general terms, is a superconducting loop interrupted by some number of Josephson junctions. While a biasing element is not illustrated in the simplified example of FIG. 1, in general operation, a flux qubit is biased by a flux in units of the superconducting flux quantum $\Phi_0$. When the applied bias flux is near one-half of a flux quantum and for suitable device parameters, the potential energy of the system exhibits two minima, one corresponding to clockwise and the other to counterclockwise current flow in the superconducting loop. The two possible directions of current flow represent the lowest energy quantum states of the system. While it is also possible to have a single potential well even at half a flux quantum of bias flux, the double-well regime described here highlights the unique capability of the inventive coupler to function even with energetically degenerate states.

A quantum system comprising the two flux qubits 12 and 14 has four energy minima, assuming both qubits are biased appropriately. Using $|0\rangle$ to refer to a first direction (e.g., clockwise) of current flow and $|1\rangle$ to apply to a second direction (e.g., counter-clockwise) in the standard basis, the four states representing the energy minima are $|00\rangle$, $|01\rangle$, $|10\rangle$, and $|11\rangle$. The energy minima are separated by potential barriers, such that a transition from one minima to another generally requires, in the absence of quantum tunneling, application of energy to the system to bring one or both qubits into an excited state and then allow the excited qubit or qubits to fall back into one of the energy minima.

A quantum circuit can be designed such that there is a non-zero probability that the state of a given qubit can change without the application of energy. In general, the Josephson junctions in a flux qubit loop create a potential with two or more minima and a barrier through which the multi-dimensional phase wave-function can tunnel. In accordance with an aspect of the present invention, the XX coupler 16 creates a plurality of tunneling paths between the potential minima associated with the multiple states of the first and second flux qubits 12 and 14, such that a tunneling path between pairs of ground states having equal bit parity are created. In other words, the XX coupler 16 allows the system formed by the two qubits to tunnel between the states $|00\rangle$ and $|11\rangle$ as well as between the states $|01\rangle$ and $|10\rangle$. Effectively, a first tunneling path creates a first interaction $g_1(|01\rangle\langle 10|+|10\rangle\langle 01|)$, where $g_1$ is the strength, or tunneling energy of the first interaction, and a second tunneling path creates a second interaction $g_2(|00\rangle\langle 11|+|11\rangle\langle 00|)$, where $g_2$ is the strength of the second interaction. The interaction strength, $g_i$, for a given tunneling path depends on the height of the tunneling barrier between the two states is and is equal to half the energy splitting between the ground states and excited states of the coupling term. The sum of the two interactions is the XX interaction as written in the standard, or Z, basis.

An advantage of the proposed XX coupler 16 is that it can provide an XX interaction without coupling the qubits along other axes of the Bloch sphere or introducing single qubit effects, such as single qubit tunneling. When the coupler Josephson junctions have slightly different critical currents due to fabrication variation, the coupler can produce an interaction $g_{XX}XX+g_{YY}YY+g_{ZZ}ZZ$, where the signs of $g_{YY}$ and $g_{ZZ}$ can be positive or negative depending on the relative values of the coupler junctions' critical currents. The magnitudes of $g_{YY}$ and $g_{ZZ}$ can be tuned to zero by replacing one or more junctions with tunable junctions, such as compound junctions. For example, where compound junctions are used, and the coupling strengths can be tuned by adjusting the flux in the compound junction loops. If the junction variation is small, only a single tunable junction may be needed to tune $g_{YY}$ and $g_{ZZ}$ to zero. For large junction variations, multiple junctions may be replaced with tunable junctions to tune $g_{YY}$ and $g_{ZZ}$ to zero. This also allows the XX coupling strength to be adjusted and even set to zero if desired. Where a pure ZZ coupling is desired, the tunneling barriers can be raised using a first set of control fluxes, thereby shutting off all tunneling between potential minima, and both 00 and 11 minima can be raised or lowered in energy relative to the 01 and 10 minima using a second set of control fluxes. Further, the proposed coupler can be used for qubits having degenerate energy states, that is, energy states having the same energy. Flux qubits are a common example of a qubit that can be operated with degenerate ground states. The inventors have found that, given current fabrication techniques, coupling strengths as high as two gigahertz between two flux qubits can be achieved via the proposed coupler.

Figure 2:
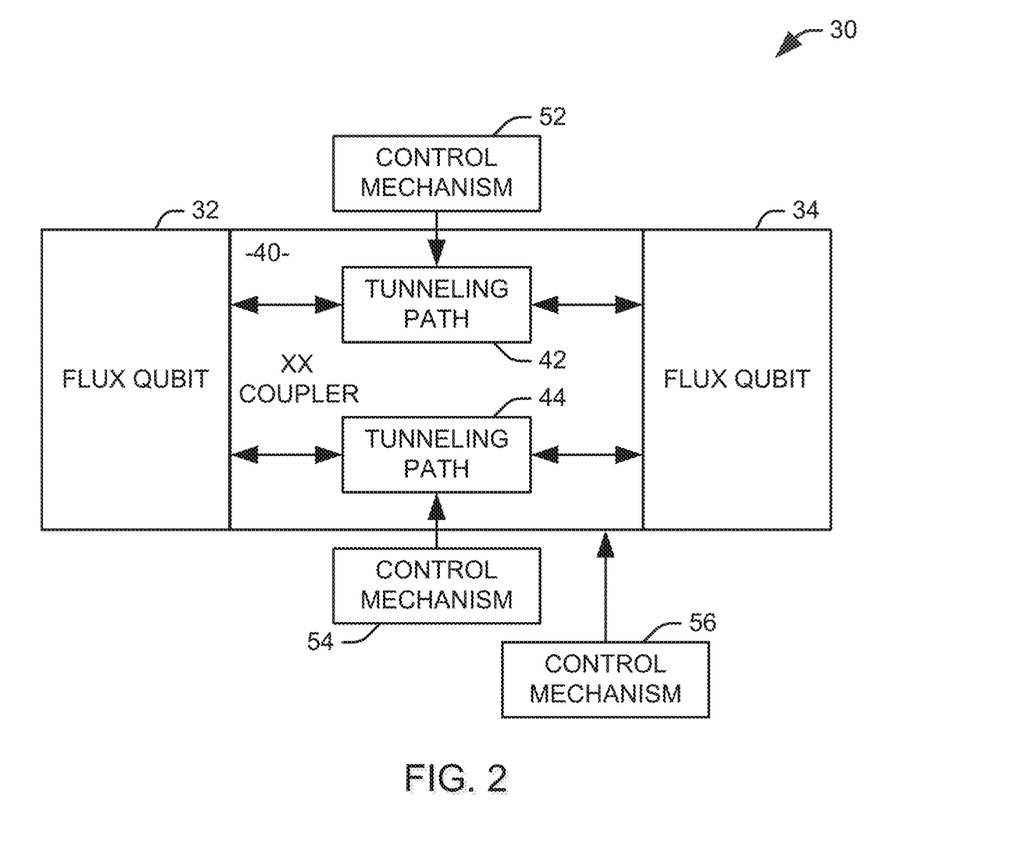
FIG. 2 illustrates a high level schematic of a quantum circuit for generating an XX interaction.

FIG. 2 illustrates a high level schematic of a quantum circuit 30 for generating an XX interaction. It will be appreciated that, in contrast to the more specific examples of FIGS. 3, 5, and 6, the illustrated circuit is provided at a conceptual level to better explain the concepts involved. The circuit 30 includes a first flux qubit 32 and a second flux qubit 34 joined by an XX coupler 40. The coupler 40 is configured to create a first tunneling path 42 and a second tunneling path 44 between potential energy minima, representing quantum states of the system including by the two flux qubits 32 and 34. A first control mechanism 52 creates one or more control fluxes that change the tunneling strength along the first tunneling path 42 and the absolute energies of states coupled via the first tunneling path. A second control mechanism 54 creates one or more control fluxes that change the tunneling strength along the second tunneling path 44 and the absolute energies of states coupled via the second tunneling path. A third control mechanism 56 provides voltages signals that set offset charge values on specific nodes of the quantum circuit, comprising both flux qubits and coupler. The control of offset charge enables the sign of the XX coupling to be adjusted to either positive or negative.

Figure 3:
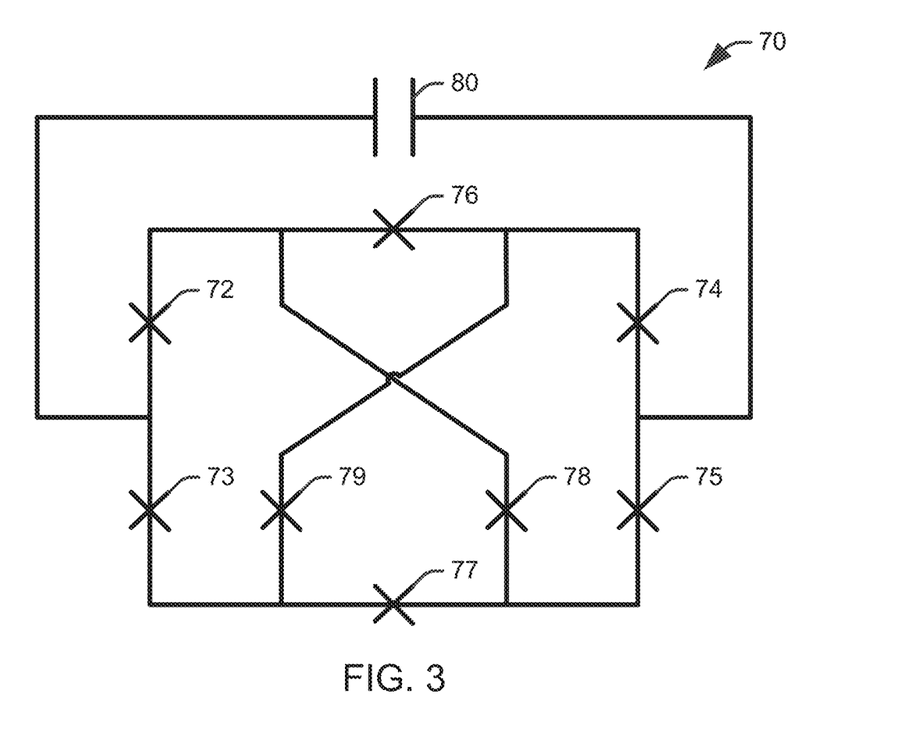
FIG. 3 is one example of a quantum circuit for generating an XX interaction between two flux qubits.

FIG. 3 is one example of a quantum circuit 70 for generating an XX interaction between two flux qubits. In the illustrated implementation, the two flux qubits are not tunable, and are integrated at least partially into the coupler assembly itself, and the circuit 70 can be conceptualized as a single assembly with, for suitable circuit parameters, doubly degenerate ground states $$\frac{|00\rangle + |11\rangle}{\sqrt{2}} \text{ and } \frac{|01\rangle + |10\rangle}{\sqrt{2}}.$$

Here, the state (0 or 1) of a first flux qubit represents the direction of the current passing through first and second Josephson junctions 72 and 73, and a state (0 or 1) of a second flux qubit represents the direction of the current passing through third and fourth Josephson junctions 74 and 75. While, as described above, the flux qubits are integral with the coupler, the coupler can be considered to include fifth, sixth, seventh, and eighth Josephson junctions 76-79 as well as a capacitor 80. It should be noted that any number of junctions could be replaced with a tunable junction, such as a flux-tunable compound junction. Incorporating two tunable junctions is sufficient for a high purity XX interaction in the presence of moderate junction asymmetry. The circuit of FIG. 3 can also be viewed as instance of the circuit in FIG. 6 where the two junctions, 214 and 224, have been replaced by compound junctions and tuned to nearly zero Josephson energy. In this case the two junctions, 214 and 224, can be omitted from the circuit, producing the simplified circuit if FIG. 3.

Each Josephson junction 72-79 as well as the capacitor 80 has a superconducting phase, $\delta_i$, across the component. For the purpose of example, each of the first and second Josephson junctions 72 and 73 will be assumed to have a same superconducting phase of $\delta_1$, each of the third and fourth Josephson junctions 74 and 75 will be assumed to have a same superconducting phase of $\delta_2$. Given this assumption, a potential, $U_C$, due to the coupler can be written as:

$$U_C = -E_5 \cos(\delta_1+\delta_2-\delta_3) - E_6 \cos(\delta_1+\delta_2+\delta_3-2\pi f_1) - E_7 \cos(-\delta_1+\delta_2+\delta_3+2\pi f_2) - E_8 \cos(\delta_1-\delta_2+\delta_3+2\pi f_3) \quad \text{Eq. 1}$$

where $E_5$ is a Josephson energy of the fifth Josephson junction 76, $E_6$ is a Josephson energy of the sixth Josephson junction 77, $E_7$ is a Josephson energy of the seventh Josephson junction 78, $E_8$ is a Josephson energy of the eighth Josephson junction 79, $\delta_3$ is a superconductive phase across the capacitor 80, $f_1$ is the flux, in flux quanta, through the loop of the assembly containing junctions 72 through 77, $f_2$ is the flux, in flux quanta, through the loop of the assembly containing the junctions 72, 73, 77, and 78, and $f_3$ is the flux, in flux quanta, through the loop of the assembly containing junctions 74, 75, 77 and 79.

For $E_5=E_6=E_7=E_8=E$, $f_1=0$, and $f_2=f_3=0.5$, the potential can be rewritten as:

$$U_C = 4E \cos(\delta_1)\sin(\delta_2)\cos(\delta_3) \quad \text{Eq. 2}$$

This potential has the desirable property that for $\delta_3=0$, energy is positive along the line $\delta_1=\delta_2$ and negative along the line $\delta_1=-\delta_2$. At $\delta_3=\pi$, the opposite is true—energy is negative along the line $\delta_1=\delta_2$ and positive along the line $\delta_1=-\delta_2$. Now, two uncoupled flux qubits, having Josephson junctions with phase variables $\delta_1$ and $\delta_2$, respectively, will have a potential with four minima at $[\pm\delta_0, \pm\delta_0]$, where $|\delta_0|$ is the magnitude of the phase at the minima of the double well potential for each flux qubit. Introducing the coupler raises the energy of the two states $\pm[\delta_0,\delta_0]$ relative to the two states $[\pm\delta_0, \mp\delta_0]$ at $\delta_3=0$ and vice versa at $\delta_3=\pi$. Accordingly, pairs of minima are located in separate planes of constant $\delta_3$.

Figure 4:
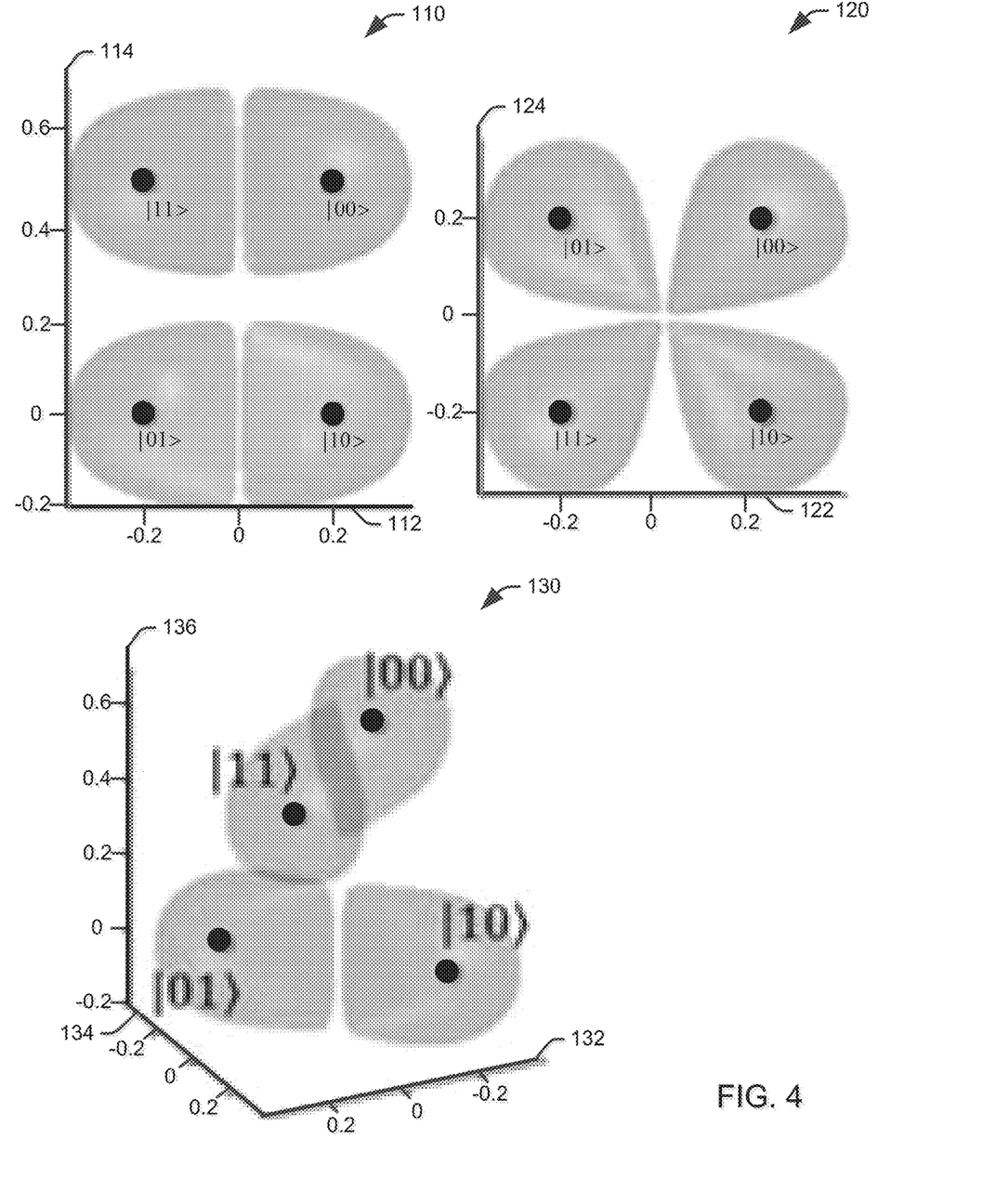
FIG. 4 is an energy diagram representing the circuit of FIG. 3 in a phase basis.

FIG. 4 is an energy diagram representing the circuit of FIG. 3 in terms of the superconducting phases $\delta_1$, $\delta_2$, and $\delta_3$. In the energy diagram, the grey shapes represent surfaces having a same energy, and the smaller solid black shapes represent the four minima of the potential. The four minima are labeled based on the sign of the phases of $\delta_1$ and $\delta_2$ at the minima, which determine the direction of current flow in the qubits. A first view 110 of the energy diagram depicts a projection of the energy diagram into the $\delta_2$-$\delta_3$ plane. A horizontal axis 112 represents a value for the superconducting phase, $\delta_2$, of the Josephson junctions 74 and 75 associated with the second qubit, in radians divided by $2\pi$ and a vertical axis 114 represents a value for the superconducting phase, $\delta_3$, of the capacitor 80 associated, in radians divided by $2\pi$. It will be appreciated that two of the minima, $|01\rangle$ and $|10\rangle$, are located on the plane $\delta_3=0$, and the other two minima, $|00\rangle$ and $|11\rangle$, are located on the plane corresponding to $\delta_3/2\pi=0.5$, or more simply, $\delta_3=\pi$.

A second view 120 of the energy diagram depicts a projection of the energy diagram into the $\delta_1$-$\delta_2$ plane. A horizontal axis 122 represents a value for the superconducting phase, $\delta_1$, of the Josephson junctions 72 and 73 associated with the first qubit, in radians divided by $2\pi$ and a vertical axis 124 represents a value for the superconducting phase, $\delta_2$, of the Josephson junctions 74 and 75 associated with the second qubit, in radians divided by $2\pi$. It will be appreciated that two of the minima, $|01\rangle$ and $|10\rangle$, are located on the plane $\delta_1=-\delta_2$, and the other two minima, $|00\rangle$ and $|11\rangle$ are located on the plane, $\delta_1=\delta_2$. A third view 130 of the energy diagram depicts a perspective view. As with the other views 110 and 120, a first axis 132 represents a value for the superconducting phase, $\delta_1$, of the Josephson junctions 72 and 73 associated with the first qubit, in radians divided by $2\pi$, a second axis 134 represents a value for the superconducting phase, $\delta_2$, of the Josephson junctions 74 and 75 associated with the second qubit, in radians divided by $2\pi$, and a third axis 136 represents a value for the superconducting phase, $\delta_3$, of the capacitor 80 associated, in radians divided by $2\pi$.

As can be seen from the diagram, if the wave function spread is large in the $\delta_1$-$\delta_2$ plane, to enable tunnel-coupling, but small in the $\delta_3$ direction, the desired ground states, $(|00\rangle+|11\rangle)/\sqrt{2}$ and $(|01\rangle+|10\rangle)/\sqrt{2}$ will form. The strength of the $-XX$ interaction is given by the strength of the tunnel coupling between potential minima. When there are multiple tunneling paths from one minima to another, it is possible for offset charges to affect the tunneling energy due to interference from the Aharonov-Casher effect. Further, it will be appreciated that a capacitance of the capacitor 80 can be selected to decrease the wave-function spread in one direction. This decrease in the spread of the wave function can decouple the two sets of minima, allowing for the coupler to achieve the two aforementioned ground states. It will be appreciated that functional coupler can also be constructed where one or more of junctions 72-75 in FIG. 3 are replaced with inductors of suitable value. It will also be appreciated that, by adding suitable inductors, this circuit can couple two flux qubits via mutual inductance such that the qubits and couplers are electrically isolated from each other.

Figure 5:
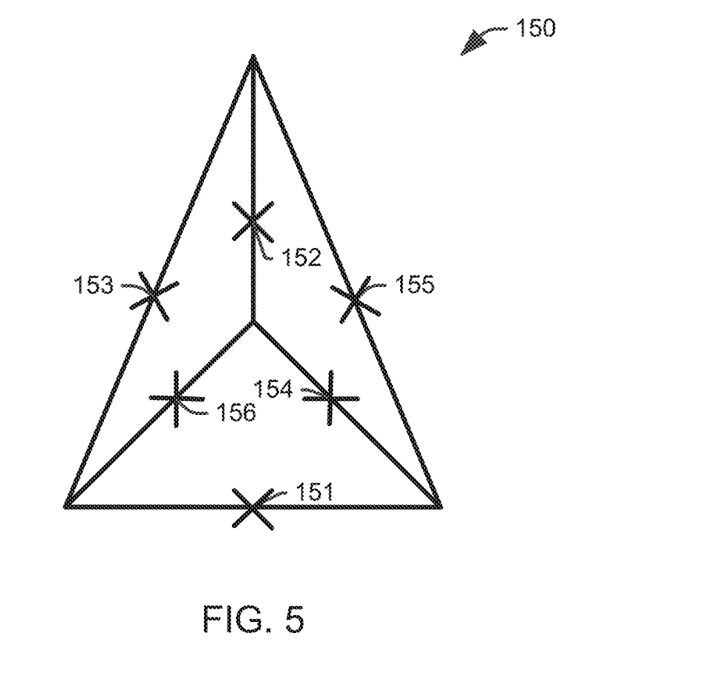
FIG. 5 is another example of a quantum circuit for generating an XX interaction between two flux qubits.

FIG. 5 is another example of a quantum circuit 150, comprising a plurality of Joesphson junctions 151-156, for generating an XX interaction between two flux qubits. As in FIG. 3, the two flux qubits are not tunable, and are integrated into the coupler assembly itself. In general terms, however, a state of a first flux qubit is represented by the direction of the current passing through junction 153, and a state of a second flux qubit is represented by the direction of the current passing through junction 155. While the flux qubits are integral with the coupler, the coupler can be considered to include first and second Josephson junctions 151 and 152. It will be appreciated, however, that any number of junctions could be replaced with a compound Josephson junction or other element having a tunable Josephson energy. Incorporating tunable junctions is sufficient for a high purity XX interaction in the presence of junction asymmetry, for example, due to minor variances in the fabrication process.

Figure 6:
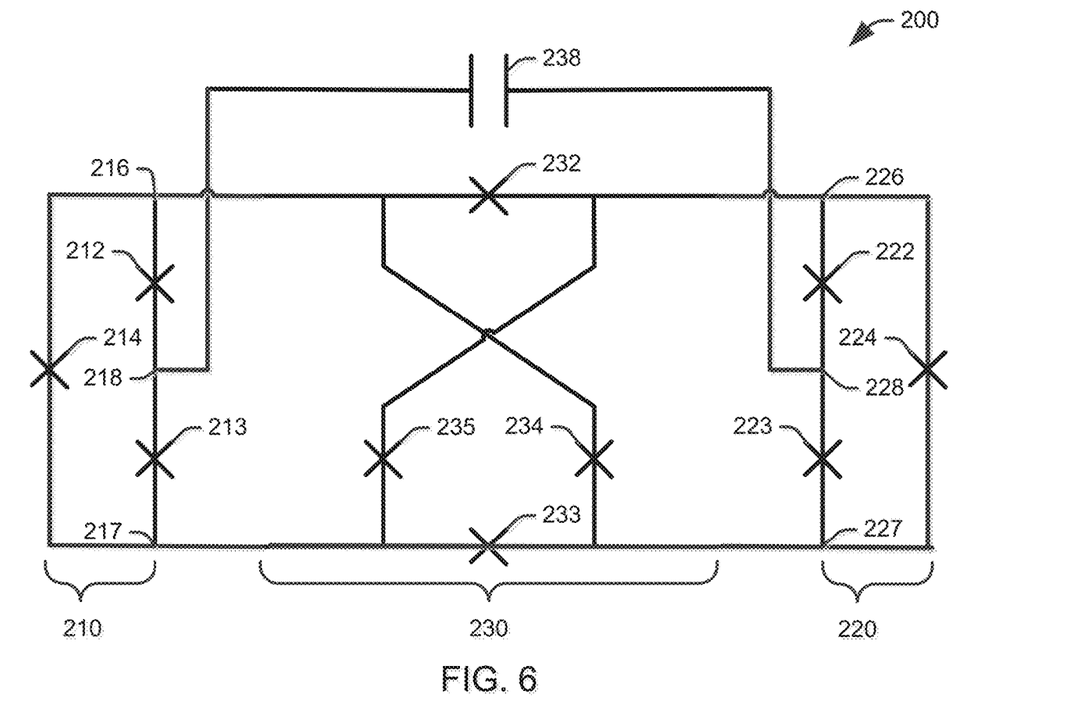
FIG. 6 is still another example of a quantum circuit for generating an XX interaction between two flux qubits.

FIG. 6 is yet another example of a quantum circuit 200 for generating an XX interaction between two flux qubits 210 and 220. In the illustrated implementation, each flux qubit 210 and 220 is tunable via an applied flux, such that either or both of a relative energy of the energy levels of the qubit and a barrier height between the energy states can be tuned. A first flux qubit 210 comprises three Josephson junctions 212-214 arranged in a loop enclosing nominally one half of a flux quantum. A second flux qubit 220 comprises three Josephson junctions 222-224 arranged in a loop enclosing nominally one half of a flux quantum.

A coupler 230 comprises a first Josephson junction 232 connected to each of the first reference node 216 and the fourth reference node 226, and a second Josephson junction 233 connected to each of the second reference node 217 and the fifth reference node 227. A third Josephson junction 234 is connected to each of the first reference node 216 and the fifth reference node 227, and a fourth Josephson junction 235 is connected to each of the second reference node 217 and the fourth reference node 226, such that the coupler forms a "twisted loop" comprising the four Josephson junctions. A capacitor 238 is connected to each of the third reference node 218 and the sixth reference node 228.

It will be appreciated that the Josephson energy of a Josephson junction is generally static. In one implementation, one or more of the Josephson junctions 232-235 comprising the coupler 230 can be replaced with a tunable element having a Josephson energy that is tunable via an applied flux or other control signal. One example of such an element is a compound Josephson junction. In practice, at least one tunable junction is advisable to correct for variance in the fabrication process even under the best of circumstance, and in practice, two tunable junctions can be used for this purpose. In one implementation, all of the Josephson junction 232-235 can be made tunable such that the tunneling energies of the tunneling paths created by the coupler can be tuned to alter or eliminate the coupling provided by the device. For example, the tunneling energies can be reduced to near zero to eliminate the XX coupling or made unequal to add an element of ZZ coupling. In another implementation, the capacitor 238 can be omitted and offset charges, controlled by gate voltages, can be used to suppress undesired tunneling and control the sign of the coupling. This is possible via Aharonov-Casher interference, whereby offset charge on a superconducting island in the circuit induces a phase difference between two tunneling paths from on minimum to another. When the offset charge is 0.5 Cooper pairs, the interference is destructive and tunneling does not occur. When the offset charge is between 0.5 and 1 Cooper pair, the tunneling energy can be negative leading to an anti-symmetric ground state as is the case for a positive XX coupling.

Figure 7:
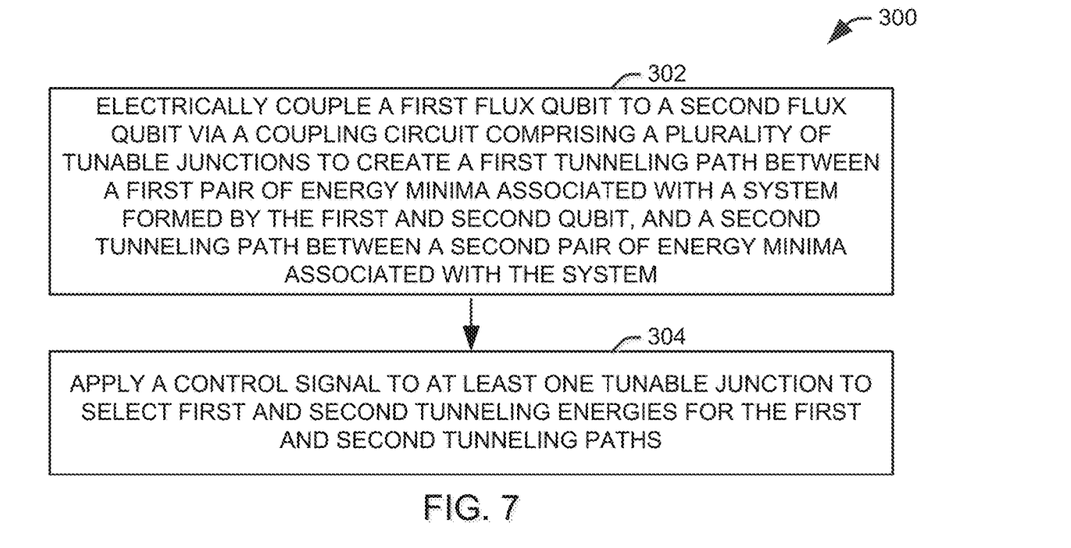
FIG. 7 illustrates one example of a method for coupling quantum states of two flux qubits.

In view of the foregoing structural and functional features described above in FIGS. 1-6, example methods will be better appreciated with reference to FIG. 7. While, for purposes of simplicity of explanation, the method of FIG. 7 is shown and described as executing serially, it is to be understood and appreciated that the present invention is not limited by the illustrated order, as some actions could in other examples occur in different orders and/or concurrently from that shown and described herein.

FIG. 7 illustrates one example of a method 300 for coupling quantum states of two flux qubits. At 302, a first flux qubit is electrically coupled to a second flux qubit via a coupler comprising a plurality of Josephson junctions, with at least one being tunable, in addition to capacitive and/or mutual inductive and/or galvanic interactions. The coupler creates a first tunneling path, between a first pair of energy minima associated with a system formed by the first and second qubit, and a second tunneling path, between a second pair of energy minima associated with the system. In one implementation, tunneling paths are formed between minima representing states of the system having equal bit parity, that is, between the states |00⟩ and |11⟩ and between the states |01⟩ and |10⟩.

At 304, a control signal, such as current, producing flux or voltage, is applied to at least one of the one or more tunable junctions to select a first tunneling energy associated with the first tunneling path and a second tunneling energy associated with the second tunneling path. In accordance with an aspect of the present invention, the selection of the tunneling energies via the applied signal can control the coupling behavior of the coupler. For example, if the control signal is applied such that the first and second coupling energies are substantially equal, an XX coupling between the first flux qubit and the second flux qubit is produced. To maintain a pure XX coupling, one or more other tunable Josephson junctions may be adjusted with a control signal to ensure that single qubit tunneling effects and YY and ZZ couplings are avoided. In another example, the control signal can be applied such that the first and second coupling energies are not equal to provide an XX coupling, a YY coupling and/or a ZZ coupling between the first flux qubit and the second flux qubit. Finally, the control signal can be applied such that the first and second coupling energies are substantially equal to zero as to selectively decouple the first flux qubit and the second flux qubit. Accordingly, the coupling provided by the coupler can be controlled for quantum logic gate operations and other applications.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A method for coupling quantum states of two flux qubits, comprising:
    electrically coupling a first flux qubit to a second flux qubit via a coupler comprising at least one tunable Josephson junctions to create a first tunneling path, between a first pair of potential energy minima associated with a system formed by the first and second qubit, and a second tunneling path, between a second pair of potential energy minima associated with the system; and
    applying a control flux to the at least one tunable junction to tune one of a first tunneling energy associated with the first tunneling path and a second tunneling energy associated with the second tunneling path such that single qubit tunneling effects are avoided.

2. The method of claim 1, wherein applying the control flux to the at least one of the plurality of tunable junctions comprises applying the control flux to the at least one of the plurality of tunable junctions such that the first tunneling energy and the second tunneling energy are substantially equal to provide an XX coupling between the first flux qubit and the second flux qubit.

3. The method of claim 1, wherein applying the control flux to the at least one of the plurality of tunable junctions comprises applying the control flux to the at least one of the plurality of tunable junctions such that the first tunneling energy and the second tunneling energy are not equal to provide an XX coupling and a ZZ coupling between the first flux qubit and the second flux qubit.

4. The method of claim 1, wherein applying the control flux to the at least one of the plurality of tunable junctions comprises applying the control flux to the at least one of the plurality of tunable junctions such that the first tunneling energy and the second tunneling energy are substantially equal to zero as to selectively decouple the first flux qubit and the second flux qubit.

5. A quantum circuit assembly comprising:
a first flux qubit, having at least two potential energy minima;
a second flux qubit, having at least two potential energy minima, such that a system formed by the first qubit and the second qubit has at least four potential energy minima prior to coupling, each of the four potential energy minima containing a quantum state of a system comprising the first flux qubit and the second flux qubit; and
a coupler, comprising a plurality of tunable Josephson junctions and a capacitor, operatively connected to each of the first flux qubit and the second flux qubit, that creates a first tunneling path between a first potential energy minimum of the system and a second potential energy minimum of the system, and a second tunneling path between a third potential energy minimum of the system and a fourth potential energy minimum of the system, the coupler being tunable via a control signal applied to at least one of the plurality of tunable junctions to tune a first tunneling energy associated with the first tunneling path and a second tunneling energy associated with the second tunneling path, wherein the capacitor decreases a spread of a wave function of the system to decouple the first potential energy minimum of the system and the second potential energy minimum of the system from the third potential energy minimum of the system and the fourth potential energy minimum of the system.

6. The quantum circuit assembly of claim 5, wherein the control signal is applied to the at least one of the plurality of tunable junctions to select first and second coupling energies that are substantially equal as to provide an XX coupling between the first flux qubit and the second flux qubit.

7. The quantum circuit assembly of claim 5, wherein, in a phase basis defined by a first superconducting phase, $\delta_1$, associated with the first flux qubit, a second superconducting phase, $\delta_2$, associated with the second flux qubit, and a third superconducting phase, $\delta_3$, associated with capacitor, the coupler introduces a potential energy to the system that is positive along a line $\delta_1=\delta_2$ and negative along a line $\delta_1=\delta_2$ in a plane $\delta_3=0$, and negative along the line $\delta_1=\delta_2$ and positive along the line $\delta_1=-\delta_2$ in a plane $\delta_3=\pi$.

8. The quantum circuit assembly of claim 5, wherein the coupler creates the first and second tunneling paths between potential energy minima representing states of equal bit parity, such that the first potential energy minimum represents the state $|01\rangle$, the second potential energy minimum represents the state, $|10\rangle$, the third potential energy minimum represents the state $|00\rangle$, and the fourth potential energy minimum represents the state, $|11\rangle$.

9. A method for coupling quantum states of two flux qubits, comprising:
electrically coupling a first flux qubit to a second flux qubit via a coupler comprising at least one tunable Josephson junctions to create a first tunneling path, between a first pair of potential energy minima associated with a system formed by the first and second qubit, and a second tunneling path, between a second pair of potential energy minima associated with the system; and
applying a control flux to a tunable junction of the at least one tunable Josephson junctions to tune a first tunneling energy associated with the first tunneling path to be substantially equal to a second tunneling energy associated with the second tunneling path to provide a pure XX coupling between the first flux qubit and the second flux qubit.

10. The method of claim 9, wherein applying the control flux to the at least one of the plurality of tunable junctions comprises applying the control flux to the at least one of the plurality of tunable junctions such that single qubit tunneling effects are avoided.

* * * * *